(12) United States Patent
Yang

(10) Patent No.: US 8,502,443 B2
(45) Date of Patent: Aug. 6, 2013

(54) ORGANIC LIGHT-EMITTING DISPLAY APPARATUS AND METHOD OF MANUFACTURING THE SAME

(75) Inventor: Nam-Choul Yang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 265 days.

(21) Appl. No.: 12/414,031

(22) Filed: Mar. 30, 2009

(65) Prior Publication Data

US 2009/0243483 A1 Oct. 1, 2009

(30) Foreign Application Priority Data

Apr. 1, 2008 (KR) ........................ 10-2008-0030301

(51) Int. Cl.
*H01J 1/62* (2006.01)
(52) U.S. Cl.
USPC ............ 313/504; 313/503; 313/505; 313/506
(58) Field of Classification Search
USPC .......... 313/495–512; 257/40, 72, 79, 98–100, 257/642–643, 759; 445/24
See application file for complete search history.

(56) References Cited

U.S. PATENT DOCUMENTS

| 6,527,368 | B1 * | 3/2003 | Giri et al. | 347/44 |
| 7,132,801 | B2 * | 11/2006 | Park et al. | 315/169.3 |
| 2002/0140643 | A1 * | 10/2002 | Sato | 345/76 |
| 2004/0096697 | A1 * | 5/2004 | Tai et al. | 428/690 |
| 2004/0119419 | A1 * | 6/2004 | Kai et al. | 315/169.3 |
| 2006/0158107 | A1 * | 7/2006 | Kai et al. | 313/504 |
| 2006/0284549 | A1 * | 12/2006 | Lee | 313/503 |
| 2007/0063649 | A1 * | 3/2007 | Yoda et al. | 313/582 |

FOREIGN PATENT DOCUMENTS

| JP | 2001-307878 | 11/2001 |
| KR | 2005-14411 | 2/2005 |
| KR | 10-2006-0077283 | 7/2006 |
| KR | 10-0639016 | 10/2006 |

OTHER PUBLICATIONS

Registration Determination Certificate issued Nov. 30, 2009, in corresponding Korean Patent Application No. 10-2008-0030301.
Office Action issued in corresponding Korean Patent Application No. 10-2008-0030301 dated Jun. 12, 2009.

* cited by examiner

*Primary Examiner* — Anne Hines
*Assistant Examiner* — Jacob R Stern
(74) *Attorney, Agent, or Firm* — Christie, Parker & Hale, LLP

(57) ABSTRACT

An organic light-emitting display apparatus and a method of manufacturing the same, the apparatus including: a substrate; a first electrode formed on the substrate; an intermediate layer formed on the first electrode, including an organic emissive layer; a second electrode formed on the intermediate layer; and an insulating member interposed between the intermediate layer and the second electrode, on an edge of the first electrode.

11 Claims, 5 Drawing Sheets

ORGANIC LIGHT-EMITTING DISPLAY APPARATUS AND METHOD OF MANUFACTURING THE SAME

CROSS-REFERENCE TO RELATED PATENT APPLICATION

This application claims the benefit of Korean Patent Application No. 2008-30301, filed on Apr. 1, 2008, in the Korean Intellectual Property Office, the disclosure of which is incorporated herein in its entirety by reference.

BACKGROUND OF THE INVENTION

1. Field of the Invention

Aspects of the present invention relate to an organic light-emitting display apparatus and a method of manufacturing the same, and more particularly, to an organic light-emitting display apparatus having improved luminescent properties.

2. Description of the Related Art

In recent years, conventional display apparatuses have been replaced by portable, thin, flat panel display apparatuses. Among flat panel display apparatuses, organic or inorganic light-emitting display apparatuses, which are self-emitting display apparatuses, have advantages, such as a wide viewing angle, a high contrast, and a rapid response speed, and thus, have been spotlighted as the next generation display apparatuses. In particular, organic light-emitting display apparatuses, including a light-emitting layer formed of an organic material, have a better brightness, a lower driving voltage, and a higher response speed than inorganic light-emitting display apparatuses.

An organic light-emitting display apparatus includes an organic emissive device having a cathode and anode placed in conjunction with an organic emissive layer. When a voltage is applied between the cathode and the anode, visible light is produced by the organic emissive layer. Since electric charges are supplied to the organic emissive layer, via the cathode and the anode, the contact between the organic emissive layer and the cathode or the anode affects the optical properties of organic light-emitting display apparatus.

An organic light-emitting display apparatus includes a pixel definition layer, that is, an insulating layer defining sub-pixels. An opening is formed in the pixel definition layer, thereby exposing an electrode, and an organic emissive layer is formed on the electrode. In this case, a bent portion of the electrode may not contact the organic emissive layer, due to the depth of the opening.

When the portion of the organic emissive layer is spaced apart from the electrode, rather than contacting the electrode, light is abnormally emitted, or is not emitted, at the portion. Due to the abnormal portion, the luminescent properties of sub-pixels cannot be regularly realized. As a result, there is a limit in improving the luminescent properties of the organic light-emitting display apparatus.

In addition, the luminescent properties of the organic light-emitting display apparatus can deteriorate at a bent portion of the organic emissive layer. Also, the organic emissive layer may contact a lower electrode. In this case, if an edge of the lower electrode has poor surface properties, an electric field is concentrated on the edge, thereby partially deteriorating a device and reducing the lifetime of the organic light-emitting display apparatus.

Conventionally, a pixel definition layer is formed of an insulating material and is disposed on a first electrode, in order to define sub-pixels. An opening, through which the first electrode is exposed, is formed in the pixel definition layer. The intermediate layer including the organic emissive layer is formed on the first electrode and is exposed through the opening. In this case, the intermediate layer is bent, due to the height of the pixel definition layer and the shape of the opening.

In addition, due to an organic material of the intermediate layer, since it is not easy to uniformly form the intermediate layer as a thin film, the intermediate layer cannot be sufficiently formed on the pixel definition layer and the opening, thereby creating a vacancy. Besides, a portion of the intermediate layer may not contact the first electrode. Generally, this problem occurs in edge portions of a sub-pixel. In particular, when the intermediate layer is formed using heat transference, since an interval between a donor film and the first electrode is increased, when the height of the pixel definition layer is increased, it is not easy to sufficiently transfer the intermediate layer onto the first electrode. As a result, some portions of the intermediate layer may contact the first electrode.

During operation of the organic light-emitting display apparatus, an electric field is concentrated on a portion of the intermediate layer, which corresponds to an upper portion of the edge of the first electrode. This is because an electric field is concentrated on the edge of the first electrode. This is because a portion of the first electrode, which corresponds to the hole, is bent, thereby generating sharp edges. Thus, an electric field is concentrated on the sharp edges.

In this case, the portion of the intermediate layer deteriorates where an electric field is concentrated deteriorates, which also affects a normal central portion of the intermediate layer, thereby reducing the luminescent properties of the sub-pixels. As a result, the overall luminescent properties of the organic light-emitting display apparatus deteriorate, and the lifetime of the organic light-emitting display apparatus is reduced.

In particular, when the first electrode includes a conductive material is formed in a predetermined pattern, photolithography, or the like is used. In this case, the edge of the first electrode has poor surface properties. That is, surfaces of the some portions of the first electrode are eroded or fractured. In this regard, it is easier for an electric field to be concentrated on such surfaces.

A portion of the first electrode is bent, thereby generating the sharp edges. Thus, it is easier for an electric field to be concentrated on such portions. Thus, an electric field is easily concentrated on the portion of the intermediate layer, which corresponds to the upper portion of the edge of the first electrode, and thus, it is easy for the portion of the intermediate layer to deteriorate, thereby reducing the luminescent properties of the organic light-emitting display apparatus.

SUMMARY OF THE INVENTION

Aspects of the present invention provide an organic light-emitting display apparatus having improved luminescent properties and a method of manufacturing the organic light-emitting display apparatus.

According to an aspect of the present invention, there is provided an organic light-emitting display apparatus including: a substrate; a first electrode formed on the substrate; an intermediate layer formed on the first electrode, including an organic emissive layer; a second electrode formed on the intermediate layer; and an insulating member interposed between the intermediate layer and the second electrode, at an edge of the first electrode.

According to another aspect of the present invention, there is provided a method of manufacturing an organic light-emitting display apparatus, the method including: forming a first electrode on a substrate; forming an intermediate layer, including an organic emissive layer, on the first electrode; forming an insulating member on the intermediate layer, at an edge of the first electrode; and forming a second electrode, so as to cover the intermediate layer and the insulating member.

According to aspects of the present invention, the first electrode may include a first surface facing the substrate, a second opposing surface, a lateral third surface connecting the first surface to the second surface, a first edge connecting the second surface to the third surface, and a second edge connecting the first surface to the third surface. An insulating member may be disposed so as to correspond to the first edge and the second edge.

According to aspects of the present invention, the organic light-emitting display apparatus may further include: a thin film transistor (TFT) formed between the substrate and the first electrode; and a passivation layer to cover the TFT, including a hole to expose a source electrode or a drain electrode of the TFT. The first electrode is connected to the TFT, via the hole, and the insulating member is disposed to correspond to the hole.

According to aspects of the present invention, the insulating member includes a monomer and is cured by ultra violet (UV) light.

According to aspects of the present invention, the insulating member may include an acrylate monomer or an epoxy monomer.

According to aspects of the present invention, the intermediate layer may be formed using heat transference.

According to aspects of the present invention, the insulating member may be formed using heat transference.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the exemplary embodiments, taken in conjunction with the accompanying drawings, of which.

DETAILED DESCRIPTION OF THE EXEMPLARY EMBODIMENTS

Figure 1:
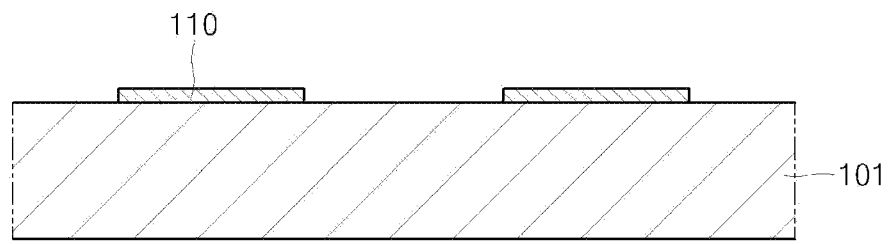
FIGS. 1 through 5 are cross-sectional views of a method of manufacturing an organic light-emitting display apparatus, according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures. As referred to herein, when a first element is said to be disposed, or formed, "on", or "adjacent to", a second element, the first element can directly contact the second element, or can be separated from the second element by one or more other elements located therebetween. In contrast, when an element is referred to as being disposed or formed "directly on" another element, there are no intervening elements present. As used herein, the term "and/or" includes any and all combinations of one or more of the associated listed items.

FIGS. 1 through 5 are cross-sectional views of a method of manufacturing an organic light-emitting display apparatus, according to an exemplary embodiment of the present invention. Referring to FIG. 1, a first electrode 110 is formed on a substrate 101. The substrate 101 may be formed of a transparent glass material having $SiO_2$ as a main component. A material to form the substrate 101 may also be a transparent plastic material, or the like. The plastic material may be an insulating organic material selected from the group consisting of polyethersulphone (PES), polyetherimide (PEI), polyethyelenen napthalate (PEN), polyethyeleneterepthalate (PET), polyphenylene sulfide (PPS), polyallylate, polyimide, polycarbonate (PC), cellulose triacetate (TAC), and cellulose acetate propionate (CAP).

In a bottom-emission type organic light-emitting display apparatus, in which images are realized toward the substrate 101, the substrate 101 is formed of a transparent material. However, in a top-emission type organic light-emitting display apparatus, in which images are realized in the opposite direction, the substrate 101 may not be formed of a transparent material. That is, the substrate 101 may be formed of a metal. In this case, the substrate 101 may include at least one selected from the group consisting of iron, chromium, manganese, nickel, titanium, molybdenum, stainless steel (SUS), an Invar alloy, an Inconel alloy, and a Kovar alloy, but the present invention is not limited thereto. The substrate 101 may also be formed of a metal foil.

A buffer layer (not shown) may be formed between the substrate 101 and the first electrode 110. The buffer layer may be used to planarize the substrate 101 and to prevent the diffusion of impurities. The buffer layer may be formed of $SiO_2$ and/or $SiN_x$, or the like.

In a top-emission type organic light-emitting display apparatus the first electrode 110 may be a reflective electrode. The first electrode 110 can include a reflective layer formed of Ag, Mg, Al, Pt, Pd, Au, Ni, Nd, Ir, Cr, Li, Ca, or a compound thereof.

In a bottom-emission type organic light-emitting display apparatus, the first electrode 110 may be a transparent electrode. The first electrode 110 may be formed of a material with a high work function, e.g., ITO, IZO, ZnO, or $In_2O_3$.

The first electrode 110 is not limited to the above materials and may also be a conductive material, or a conductive paste including conductive particles, e.g., Ag, Mg, or Cu. In the case of the conductive paste, the first electrode 110 may be formed by inkjet printing the conductive paste and then baking the printed conductive paste.

The first electrode 110 may be formed in a predetermined pattern, by photolithography. In a passive matrix (PM) type organic light-emitting display apparatus, the first electrode 110 may be in the form of stripes. In an active matrix (AM) type organic light-emitting display apparatus, the first electrode 110 may be formed to correspond to a sub-pixel.

Figure 2:
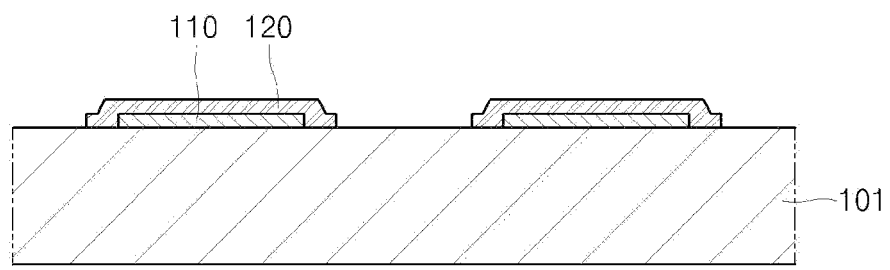

Referring to FIG. 2, an intermediate layer 120 is formed on the first electrode 110. The intermediate layer 120 includes an organic emissive layer.

The intermediate layer 120 may be formed of an organic material. When the organic emissive layer of the intermediate layer 120 is formed of a low molecular weight organic material, the intermediate layer 120 may include a hole transport layer (HTL) and a hole injection layer (HIL), which are sequentially stacked in a direction towards the first electrode 110, with respect to the emissive layer. The intermediate layer 120 may also include an electron transport layer (ETL) and an electron injection layer (EIL), which are sequentially stacked towards an opposite direction to the first electrode 110, with respect to the emissive layer. In addition, various additional layers may be formed for particular applications. An organic material used to form the intermediate layer 120 may be copper phthalocyanine (CuPc), N,N'-Di(naphthalene-1-yl)-N,N'-diphenyl-benzidine (NPB), tris-8-hydroxyquinoline aluminum (Alq3), or the like.

When the emissive layer of the intermediate layer 120 is formed of a polymer organic material, the intermediate layer 120 may include only a polymer HTL. The polymer HTL may be formed of a poly-(2,4)-ethylene-dihydroxy thiophene (PEDOT), a polyaniline (PANI), or the like, and may be formed on the first electrode 110, by ink jet printing, or spin coating. The polymer organic emissive layer may be formed of a PPV, soluble PPV's, a cyano-PPV, a polyfluorene, or the like. A color pattern may be formed in the intermediate layer 120 using a method such as ink jet printing, spin coating, or laser induced heat transference.

According to aspects of the present embodiment, the intermediate layer 120 is formed on the first electrode 110 without a pixel definition layer. Accordingly, the organic emissive layer is not bent, due to the height of the pixel definition layer. As a result, when the intermediate layer 120 is formed using heat transference, the intermediate layer 120 can uniformly contact the first electrode 110, rather than being spaced apart from the first electrode 110, which often occurs in the conventional art.

Figure 3:
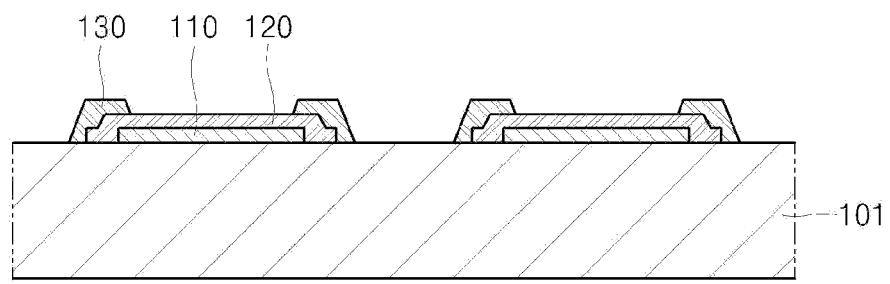

Referring to FIG. 3, an insulating member 130 is formed on the intermediate layer 120. The insulating member 130 is disposed to correspond to an edge of the first electrode 110. The insulating member 130 may be formed on opposing edges of the first electrode 110, in a direction parallel to the thickness of the first electrode 110.

The insulating member 130 may be formed using heat transference. Since the intermediate layer 120 including an organic material is disposed below the insulating member 130, the intermediate layer 120 is less affected when heat transference is used to form the insulating member 130 on the intermediate layer 120, than in the case where photolithography is used.

The insulating member 130 may include an acrylate monomer or an epoxy monomer. These materials are advantageous when the insulating member 130 is formed using heat transference, due their low molecular weights. The insulating member 130 may be cured by ultra violet (UV) light, in order to fix the shape of the insulating member 130. When UV light is used to irradiate the intermediate layer 120, a mask is used, in order not to irradiate the intermediate layer 120.

The material to form the insulating member 130 is not limited to the above examples. Thus, the insulating member 130 may be formed of a polymer such as a PMMA and a PS. The insulating member 130 may be formed using various methods including heat transference, for example.

According to aspects of the present invention, the insulating member 130 is formed on the intermediate layer 120, so as to correspond to the edge of the first electrode 110. Accordingly, after manufacture of the organic light-emitting display apparatus, when a voltage is applied to the intermediate layer 120, an electric field is not generated in the portion of the intermediate layer 120 that corresponds to the edge of the first electrode 110.

That is, when the intermediate layer 120 emits light, an electric field is not generated on a portion of the intermediate layer 120 that corresponds to the insulating member 130. Thus the portion of the intermediate layer 120 is a non-emissive region. Accordingly, an electric field is prevented from being concentrated on the portion of the intermediate layer 120, which corresponds to the upper portion of the edge of the first electrode 110, thereby preventing deterioration of the intermediate layer 120. As a result, the luminescent properties can be effectively preserved, thereby increasing the quality and lifetime of the organic light-emitting display apparatus.

Referring to FIG. 3, the insulating member 130 covers both ends of the intermediate layer 120. However, the insulating member 130 may expose an edge of the intermediate layer 120, while covering both ends of the first electrode 110. In FIG. 3, the insulating member 130 is spaced apart from an insulating member of an adjacent sub-pixel. However, the present invention is not limited thereto. That is, the insulating member 130 may be connected to the insulating member of the adjacent sub-pixel.

Figure 4:
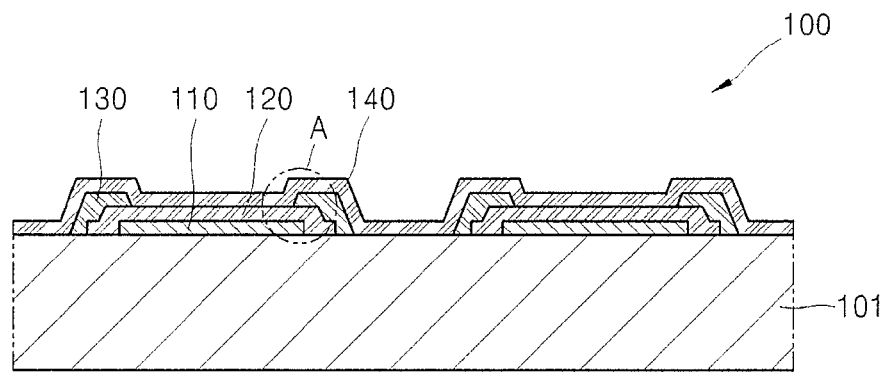

Referring to FIG. 4, the insulating member 130 is formed, and then a second electrode 140 is formed, thereby completing manufacture of an organic light-emitting display apparatus 100. The second electrode 140 covers all the sub-pixels. In a top emission type organic light-emitting display apparatus, the second electrode 140 may be a transparent electrode. The transparent second electrode 140 may be formed by depositing a material with a high work function, e.g., Ag, Mg, Al, Pt, Pd, Au, Ni, Nd, Ir, Cr. Li, Ca, or a combination thereof. An auxiliary electrode layer, or a bus electrode line, is then formed using a transparent conductive material, e.g., ITO, IZO, ZnO, or $In_2O_3$. The second electrode 140 may be a cathode.

In a double side emission type organic light-emitting display apparatus, both the first electrode 110 and the second electrode 140 may be transparent electrodes. In a bottom emission type organic light-emitting display, the second electrode 140 may be formed as a reflective electrode, and the second electrode 140 may be formed of a metal with a low work function, e.g., Ag, Mg, Al, Pt, Pd, Au, Ni, Nd, Ir, Cr, Li, or Ca. The second electrode 140 may be an anode.

A material of the second electrode 140 is not limited to the above examples and may also be formed of a conductive material or conductive paste including conductive particles, e.g., Ag, Mg, or Cu. When a conductive paste is used, the second electrode 140 may be formed by inkjet printing the conductive paste and then baking the conductive paste.

A sealing member (not shown) may be formed on the second electrode 140. The sealing member serves to protect the first electrode 110, the intermediate layer 120 and the second electrode 140 from external moisture or oxygen and may be formed of a transparent material. The sealing member may be a glass substrate, a plastic substrate, or a multi-layered structure including an organic material and an inorganic material.

In the organic light-emitting display apparatus 100, since the intermediate layer 120 is formed without a pixel definition layer, the intermediate layer 120 can easily contact the first electrode 110, although heat transference is used to form the intermediate layer 120. The organic light-emitting display apparatus 100 includes the insulating member 130. Due to the insulating member 130, an electric field can be prevented from being concentrated on the portion(s) of the intermediate layer 120 that corresponds to the edge(s) of the first electrode 110.

Figure 5:
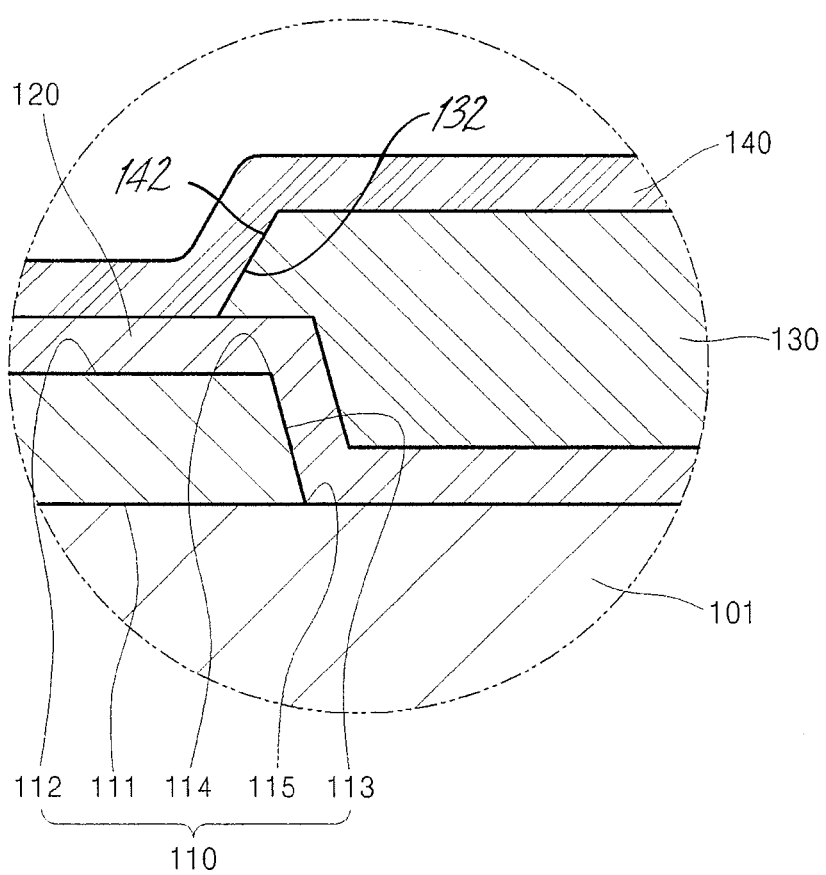

FIG. 5 is an enlarged image of portion A illustrated in FIG. 4. Referring to FIG. 5, the insulating member 130 is disposed so as to correspond to a first edge 114 and a second edge 115 of the first electrode 110. The first electrode 110 includes a first surface 111 facing the substrate 101, an opposing second surface 112, and a third surface 113 that is a lateral surface connecting the first surface 111 to the second surface 112. The second surface 112 and the third surface 113 intersect at the first edge 114. The first surface 111 and the third surface 113 intersect at the second edge 115.

When the organic light-emitting display apparatus 100 is operated, a voltage is applied between the first electrode 110 and the second electrode 140. A larger electric field may be generated at edges of the first electrode 110, in particular, at the first edge 114 and the second edge 115, than in the rest of the first electrode 110. Thus, an electric field may be abnormally concentrated on the intermediate layer 120 disposed above the first electrode 110, and accordingly the intermediate layer 120 partially deteriorates.

The insulating member 130 is disposed on the intermediate layer 120. Thus, although a voltage is applied between the first electrode 110 and the second electrode 140, an electric field is not generated on a portion of the intermediate layer 120, on which the insulating member 130 is disposed, thereby preventing the deterioration of the intermediate layer 120 and a reduction of luminescent properties of the organic light-emitting display apparatus 100, due to the abnormal concentration of the electric filed.

Figure 6:
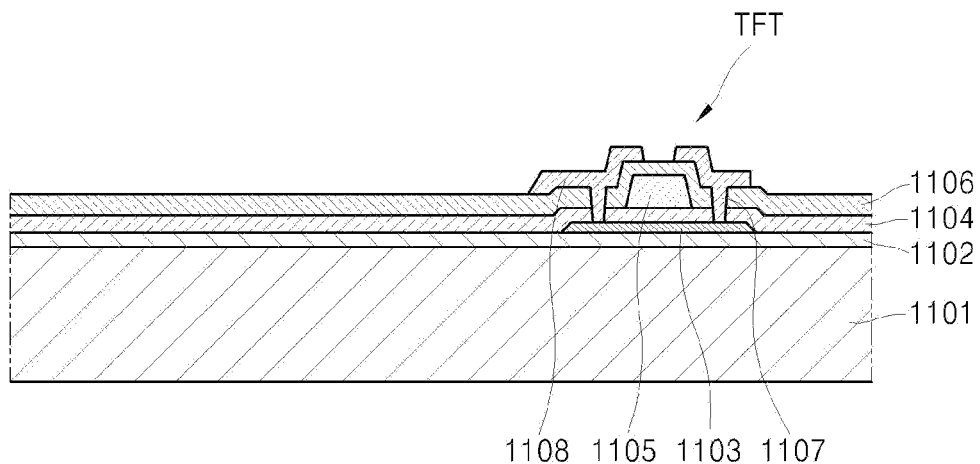
FIGS. 6 though 11 are cross-sectional views of a method of manufacturing an organic light-emitting display apparatus, according to another exemplary embodiment of the present invention.

FIGS. 6 though 11 are schematic cross-sectional views showing a method of manufacturing an organic light-emitting display apparatus, according to another exemplary embodiment of the present invention. For convenience of description, the method will be described mainly in terms of the differences from the above-described exemplary embodiment.

FIGS. 6 though 11 refer to a method of manufacturing an active matrix (AM) type organic light-emitting display apparatus. Referring to FIG. 6, a thin film transistor (TFT) is formed on a substrate 1101. At least one TFT is formed in each sub-pixel and is electrically connected to a first electrode (not shown) in a subsequent operation. For convenience of description, one TFT is illustrated in FIGS. 6 though 11, but the present invention is not limited thereto. That is, the organic light-emitting display apparatus may include a plurality of the TFTs.

A buffer layer 1102 is formed on the substrate 1101, and then an active layer 1103 is formed on the buffer layer 1102. The substrate 1101 and the buffer layer 1102 are similar to the substrate 101 and the buffer layer described above. The active layer 1103 may be formed of an inorganic semiconductor, such as amorphous silicon, or poly silicon, or an organic semiconductor, and may include a source region, a drain region, and a channel region.

The source region and drain region may be formed by doping the active layer 1103 with impurities. The active layer 1103 can be doped with boron, which is a group 3 element, thereby forming a p-type semiconductor. The active layer 1103 can be doped with nitrogen, which is a group 5 element, thereby forming an n-type semiconductor.

A gate insulating layer 1104 is formed on the active layer 1103, and then a gate electrode 1105 is formed on a predetermined portion of the gate insulating layer 1104. The gate insulating layer 1104 insulates the active layer 1103 from the gate electrode 1105 and may be formed of an organic material or an inorganic material, such as $SiN_x$, or $SiO_2$.

The gate electrode 1105 may be formed of a metal, or a metal alloy, e.g., Au, Ag, Cu, Ni, Pt, Pd, Al, Mo, an Al:Nd alloy, or an Mo:W alloy, but the present invention is not limited thereto. That is, the gate electrode 1105 may be formed of various materials, according to an adhesion with adjacent layers, a surface flatness of a staked layer, an electrical resistance, a plasticity, or the like. The gate electrode 1105 is connected to a gate line (not shown) that supplies the TFT with on/off signals.

An inter-layer insulating layer 1106, including contact holes formed therein, is formed on the gate electrode 1105. A source electrode 1107 and a drain electrode 1108 may respectively contact the source region and the drain region of the active layer 1103, via the contact holes. The source electrode 1107 and the drain electrode 1108 may be formed of Al, Mo, or a metal alloy composed of two or more metals, e.g., an Al:Nd alloy, or an MoW alloy, in addition to of Au, Pd, Pt, Ni, Rh, Ru, Ir, or Os, but the present invention is not limited thereto.

Figure 7:
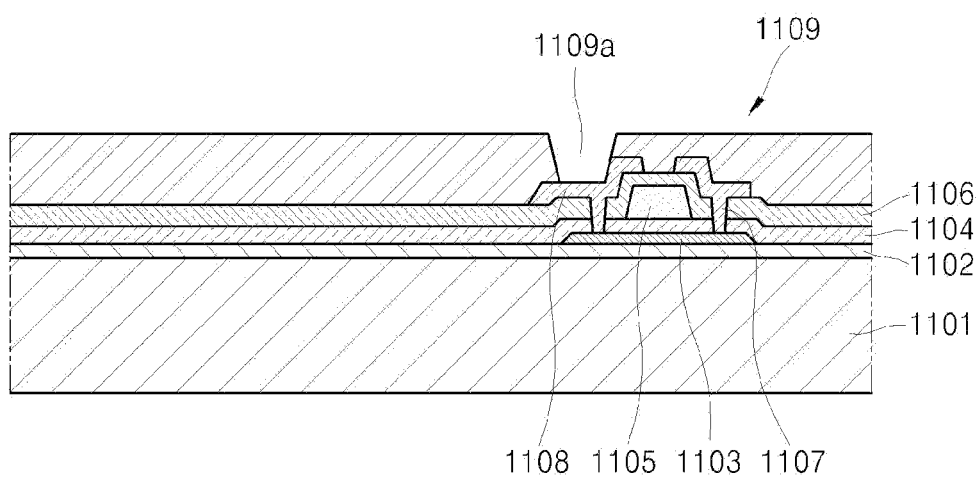

Referring to FIG. 7, the TFT is covered and protected with an insulating passivation layer 1109. The passivation layer 1109 includes a hole 1109a to expose the drain electrode 1108.

The passivation layer 1109 includes an inorganic insulating layer and/or an organic insulating layer. The inorganic insulating layer may include $SiO_2$, $SiN_x$, SiON, $Al_2O_3$, $TiO_2$, $Ta_2O_5$, $HfO_2$, $ZrO_2$, BST, PZT, or the like. The organic insulating layer may include a general polymer (e.g., PMMA or PS), a phenol group-containing polymer derivative, an acrylic polymer, an imide-based polymer, an arylether-based polymer, an amide-based polymer, a fluorinated polymer, a p-xylene-based polymer, a vinylalcohol-based polymer, or a blend thereof. The passivation layer 1109 may be formed as a composite structure including the inorganic insulating layer and the organic insulating layer.

Figure 8:
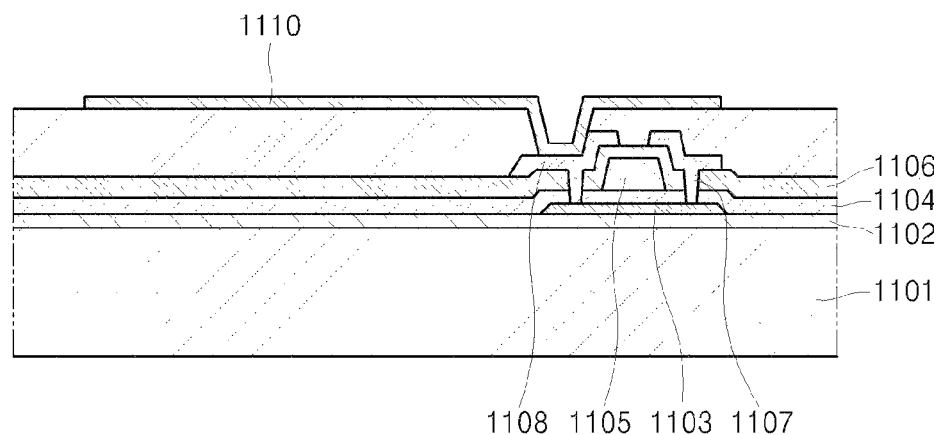

Referring to FIG. 8, after forming the passivation layer 1109, a first electrode 1110 is formed. The first electrode 1110 is connected to the drain electrode 1108, via the hole 1109a. The material and manufacturing method of the first electrode 1110 are similar to those of the first electrode 110.

Figure 9:
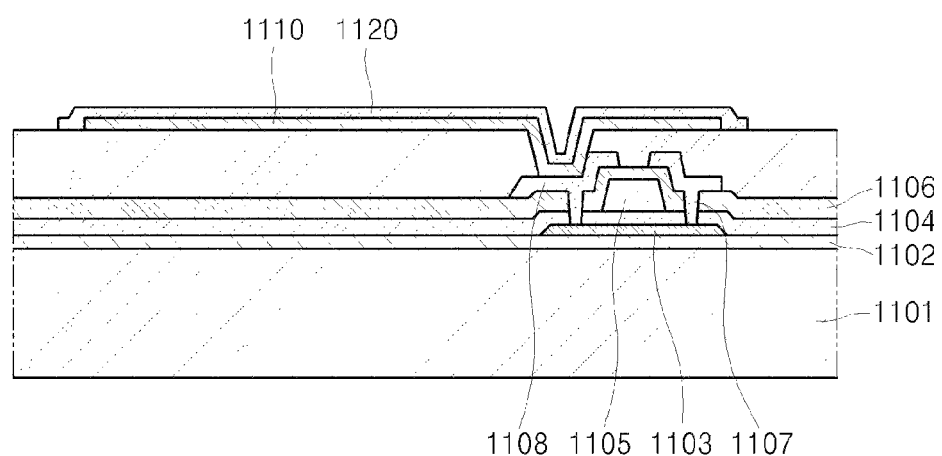

Referring to FIG. 9, after forming the first electrode 1110, an intermediate layer 1120 is formed. The intermediate layer 1120 includes an organic emissive layer. The material of the intermediate layer 1120 is similar to that of the intermediate layer 120. A color pattern in the intermediate layer 1120 may be formed using a general method, such as ink jet printing, spin coating, or laser heat transference.

The intermediate layer 1120 is formed on the first electrode 1110, without a pixel definition layer. Accordingly, the organic emissive layer is not bent due to the height of the pixel definition layer. As a result, when the intermediate layer 1120 is formed using heat transference, the intermediate layer 1120 can uniformly contact the first electrode 1110, rather than being spaced apart from the first electrode 1110.

Figure 10:
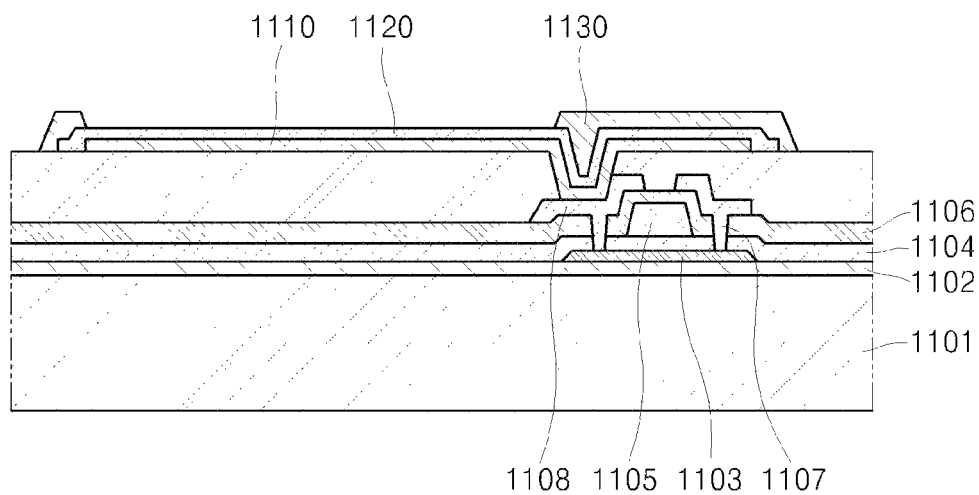

Referring to FIG. 10, after forming the intermediate layer 1120, an insulating member 1130 is formed. The insulating member 1130 is disposed so as to correspond to edges of the first electrode 1110. In addition, the insulating member 1130 is disposed so as to correspond to the hole 1109a.

The insulating member 1130 may be formed using heat transference. Since the intermediate layer 1120 is disposed below the insulating member 1130, the intermediate layer 1120 is less affected when the heat transference is used to form the insulating member 1130, than in the case where photolithography is used.

The insulating member 1130 may include an acrylate monomer or an epoxy monomer. These materials are advantageous when the insulating member 1130 is formed using heat transference, due to having low molecular weights. The insulating member 1130 may be cured by ultra violet (UV) light, in order to fix the shape of the insulating member 1130. When UV light is irradiated onto the insulating member 1130, a mask is used, in order not to irradiate the intermediate layer 1120.

The material of the insulating member 1130 is not limited to the above examples. Thus, the insulating member 1130 may be formed of a polymer such as PMMA or PS. In addition, the insulating member 1130 may be formed using various methods including heat transference, for example.

According to aspects of the present embodiment, the insulating member 1130 is formed on the intermediate layer 1120, so as to correspond to the edge(s) of the first electrode 1110 and the hole 1109a. Accordingly, when a voltage is applied to the intermediate layer 1120, an electric field is not generated in the portions of the intermediate layer 1120 that correspond to the edge(s) of the first electrode 1110 and the hole 1109a.

That is, when the intermediate later 120 emits light, an electric field is not generated on a portion of the intermediate layer 120, which corresponds to the insulating member 1130, and thus the portion of the intermediate layer 120 is a non-emissive region. Accordingly, an electric field is prevented from being abnormally concentrated on the portion of the intermediate layer 1120, which corresponds to an upper portion of the edge of the first electrode 1110 and an upper portion of the hole 1109a, thereby preventing a deterioration of the intermediate layer 1120. As a result, a reduction in the luminescent properties can be effectively prevented, thereby increasing the quality and lifetime of the organic light-emitting display apparatus.

Referring to FIG. 10, the insulating member 1130 covers both ends of the intermediate layer 1120. However, the insulating member 1130 may expose an edge of the intermediate layer 1120. In addition, the insulating member 1130 may be spaced apart from, or may be connected to, an insulating member of an adjacent sub-pixel.

Figure 11:
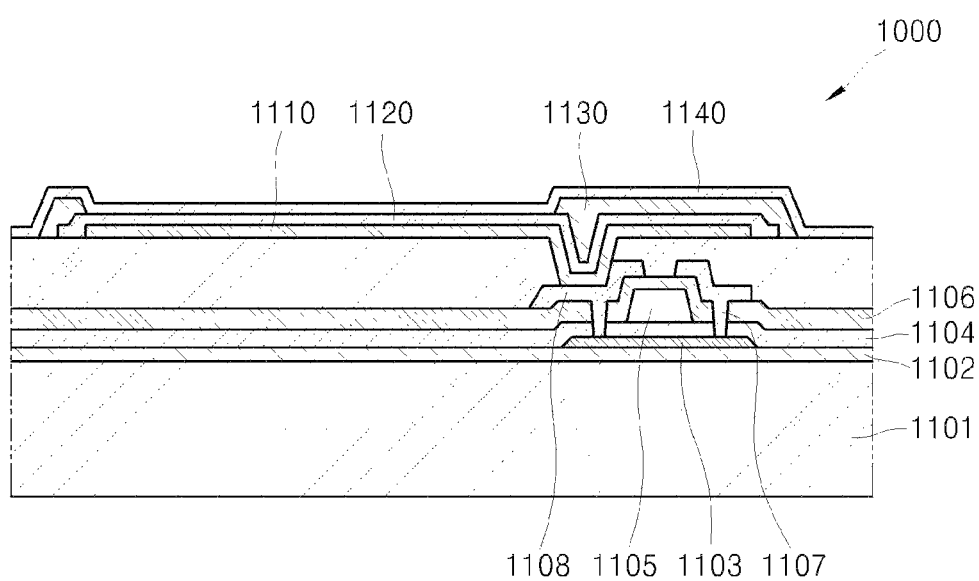

Referring to FIG. 11, after forming the insulating member 1130, a second electrode 1140 is formed, thereby forming an organic light-emitting display apparatus 1000. The second electrode 1140 is formed so as to cover all the sub-pixels. The second electrode 1140 is similar to the second electrode 140.

A sealing member (not shown) may be formed on the second electrode 1140. The sealing member serves to protect the first electrode 1110, the intermediate layer 1120 and the second electrode 1140 from external moisture, and/or oxygen, and may be formed of a transparent material. The sealing member may be a glass substrate, a plastic substrate, or a multi-layered structure including an organic material and an inorganic immaterial.

In the organic light-emitting display apparatus 1000, since the intermediate layer 1120 is formed without a pixel definition layer, the intermediate layer 1120 can easily contact the first electrode 1110, even though heat transference is used to form the intermediate layer 1120. Due to the insulating member 1130, an electric field can be prevented from being abnormally concentrated on the portion of the intermediate layer 1120 that covers the edge of the first electrode 1110. Since the insulating member 1130 is disposed on the portion of the intermediate layer 120 that corresponds to the hole 1109a and a bent portion of the first electrode 1110, an electric field can be prevented from being concentrated on the portion of the intermediate layer 1120 that corresponds to the hole 1109a.

The insulating member 1130 is disposed on the intermediate layer 1120. Accordingly, although a voltage is applied between the first electrode 1110 and the second electrode 1140, an electric field is not generated on a portion of the intermediate layer 1120, on which the insulating member 1130 is disposed, thereby preventing the deterioration of the intermediate layer 1120 and a reduction of the luminescent properties of the organic light-emitting display apparatus 1000, due to the abnormal concentration of the electric filed.

According to aspects of the present invention, in an organic light-emitting display apparatus, an intermediate layer including an organic emissive layer can be easily formed, and the luminescent properties of the organic light-emitting display apparatus can be improved.

Although a few exemplary embodiments of the present invention have been shown and described, it would be appreciated by those skilled in the art that changes may be made in these embodiments, without departing from the principles and spirit of the invention, the scope of which is defined in the claims and their equivalents.

What is claimed is:

1. An organic light-emitting display apparatus comprising:
   a substrate;
   a first electrode disposed on the substrate, the first electrode having top and side surfaces;
   an intermediate layer disposed directly on the first electrode such that the intermediate layer covers the top and side surfaces of the first electrode, the intermediate layer comprising an organic emissive layer;
   an insulating member disposed on the intermediate layer and exposing at least a portion of the intermediate layer; and
   a second electrode disposed on the intermediate layer and the insulating member,
   wherein the insulating member is disposed between the intermediate layer and the second electrode, and
   wherein the second electrode has a slanted portion contacting a slanted portion of the insulation member and located over an edge of the first electrode, the slanted portion of the insulating member overlapping the edge of the first electrode in a direction perpendicular to the substrate.

2. The organic light-emitting display apparatus of claim 1, wherein:
   the first electrode comprises a first surface that faces the substrate, an opposing second surface, a third surface connecting the first surface and the second surface, a first edge disposed at an intersection of the second surface and the third surface, and a second edge disposed at an intersection of the first surface and the third surface; and
   the insulating member is disposed on the first edge and the second edge.

3. The organic light-emitting display apparatus of claim 1, further comprising:
   a thin film transistor (TFT) disposed between the substrate and the first electrode; and
   a passivation layer disposed on the TFT, comprising a hole to expose a source electrode or a drain electrode of the TFT,
   wherein the first electrode is connected to the TFT, via the hole, and the insulating member is disposed in the hole.

4. The organic light-emitting display apparatus of claim 1, wherein the insulating member comprises a monomer and is cured by ultra violet (UV) light.

5. The organic light-emitting display apparatus of claim 1, wherein the insulating member comprises an acrylate monomer or an epoxy monomer.

6. The organic light-emitting display apparatus of claim 1, wherein the insulating member comprises:
   a first portion disposed on a first end of the intermediate layer; and
   a second portion that is separated from the first portion and is disposed on an opposing second end of the intermediate layer.

7. The organic light-emitting display apparatus of claim 1, wherein the insulating member is disposed on a non-emissive region of the intermediate layer.

8. An organic light-emitting display apparatus comprising:
   a substrate;

a first electrode disposed on the substrate, the first electrode having top and side surfaces;

an intermediate layer disposed directly on the first electrode such that the intermediate layer covers the top and side surfaces of the first electrode, the intermediate layer comprising an organic emissive layer and non-emissive regions;

an insulating member disposed on the intermediate layer, so as to form the non-emissive regions of the intermediate layer and so as to expose the emissive region of the intermediate layer; and a second electrode disposed between the intermediate layer and the insulating member, wherein the insulating member is disposed between the intermediate layer and the second electrode, and wherein the second electrode has a slanted portion contacting a slanted portion of the insulating member and located over an end of the first electrode, the slanted portion of the insulating member overlapping the end of the first electrode in a direction perpendicular to the substrate.

9. The organic light-emitting display apparatus of claim 8, further comprising:

a thin film transistor (TFT) disposed between the substrate and the first electrode; and a passivation layer disposed on the TFT, comprising a hole to expose a source electrode or a drain electrode of the TFT, wherein the first electrode is connected to the TFT, via the hole, and the insulating member is disposed in the hole.

10. The organic light-emitting display apparatus of claim 1, wherein the insulating member is between the intermediate layer and the second electrode along the direction perpendicular to the substrate.

11. The organic light-emitting display apparatus of claim 8, wherein the insulating member is disposed between the intermediate layer and the second electrode along the direction perpendicular to the substrate.

* * * * *

UNITED STATES PATENT AND TRADEMARK OFFICE
CERTIFICATE OF CORRECTION

PATENT NO. : 8,502,443 B2  Page 1 of 1
APPLICATION NO. : 12/414031
DATED : August 6, 2013
INVENTOR(S) : Nam-Choul Yang It is certified that error appears in the above-identified patent and that said Letters Patent is hereby corrected as shown below:

In the Claims

Column 10, Claim 1, line 26    Delete "insulation"
                               Insert -- insulating --

Signed and Sealed this
Twenty-third Day of December, 2014

Michelle K. Lee
*Deputy Director of the United States Patent and Trademark Office*